(12) United States Patent
Huang et al.

(10) Patent No.: US 7,321,518 B1
(45) Date of Patent: Jan. 22, 2008

(54) APPARATUS AND METHODS FOR PROVIDING REDUNDANCY IN INTEGRATED CIRCUITS

(75) Inventors: Joseph Huang, San Jose, CA (US); Chiakang Sung, Milpitas, CA (US); Philip Pan, Fremont, CA (US); Yan Chong, Mountain View, CA (US)

(73) Assignee: Altera Corporation, San Jose, CA (US)

( * ) Notice: Subject to any disclaimer, the term of this patent is extended or adjusted under 35 U.S.C. 154(b) by 327 days.

(21) Appl. No.: 10/757,928

(22) Filed: Jan. 15, 2004

(51) Int. Cl.
G11C 7/00 (2006.01)
G11C 29/00 (2006.01)
G06F 7/38 (2006.01)
H03K 19/177 (2006.01)

(52) U.S. Cl. .................. 365/200; 365/201; 365/230.06; 326/40; 326/39

(58) Field of Classification Search ................ 365/200; 327/526; 326/9, 10
See application file for complete search history.

(56) References Cited

U.S. PATENT DOCUMENTS

| 4,281,398 | A |   | 7/1981  | McKenny et al. |         |
|-----------|---|---|---------|----------------|---------|
| 4,724,422 | A |   | 2/1988  | Golab          |         |
| 4,747,080 | A | * | 5/1988  | Yamada         | 365/200 |
| 4,829,481 | A |   | 5/1989  | Johnson et al. |         |
| 4,887,239 | A |   | 12/1989 | Turner         |         |
| 5,349,555 | A |   | 9/1994  | Nakajima       |         |
| 5,485,102 | A | * | 1/1996  | Cliff et al.   | 326/10  |
| 5,796,662 | A | * | 8/1998  | Kalter et al.  | 365/200 |
| 5,821,770 | A |   | 10/1998 | Rees           |         |
| 5,825,698 | A |   | 10/1998 | Kim et al.     |         |
| 6,020,777 | A |   | 2/2000  | Bracchitta et al. |      |
| 6,115,300 | A | * | 9/2000  | Massoumi et al. | 365/200 |
| 6,205,050 | B1|   | 3/2001  | Tamaki         |         |
| 6,215,173 | B1|   | 4/2001  | Echigoya       |         |
| 6,215,715 | B1|   | 4/2001  | Lee et al.     |         |
| 6,219,286 | B1| * | 4/2001  | Fuchigami et al. | 365/200 |
| 6,236,241 | B1|   | 5/2001  | Liu et al.     |         |
| 6,281,739 | B1|   | 8/2001  | Matsui         |         |
| 6,366,508 | B1| * | 4/2002  | Agrawal et al. | 365/200 |
| 6,404,264 | B2|   | 6/2002  | Daniel et al.  |         |

(Continued)

OTHER PUBLICATIONS

Ouellette et al., "Shared Fuse Macro For Multiple Embedded Memory Devices With Redundancy", IEEE Custom Integrated Circuits Conference, 2001, pp. 191-194.
McCollum et al., "Reliability Of Antifuse-Based Field Programmable Gate Arrays For Military And Aerospace Applications", Actel Corporation, Abstract, Sep. 2001, 6 pgs.
Benedetto et al., "Amorphous Silicon Antifuse Programmable-Array-Logic Devices For High Reliability Space Applications", UTMC Microelectronic Systems, Jan. 2002, 4 pgs.

(Continued)

*Primary Examiner*—Amir Zarabian
*Assistant Examiner*—Michael Weinberg
(74) *Attorney, Agent, or Firm*—Law Offices of Maximilian R. Peterson (57) ABSTRACT

An integrated circuit (IC) includes a redundancy feature. The redundancy feature is provided by a redundancy circuitry within the IC. The redundancy circuitry is configured to provide the redundancy by using a decoder circuitry. The decoder circuitry receives and decodes coded defect information from a set of circuit elements adapted to provide the coded defect information.

50 Claims, 7 Drawing Sheets

U.S. PATENT DOCUMENTS

| | | | |
|---|---|---|---|
| 6,552,938 B1 * | 4/2003 | Anand et al. | 365/200 |
| 6,600,686 B2 | 7/2003 | Huh et al. | |
| 6,732,229 B1 * | 5/2004 | Leung et al. | 711/109 |
| 7,047,465 B1 * | 5/2006 | Trimberger | 714/725 |
| 7,061,815 B2 * | 6/2006 | Ahmad | 365/200 |
| 2002/0105854 A1 | 8/2002 | Huh et al. | |
| 2003/0206477 A1 | 11/2003 | Waller et al. | |
| 2004/0022110 A1 | 2/2004 | Haraguchi et al. | |
| 2004/0027893 A1 | 2/2004 | Kurita | |

OTHER PUBLICATIONS

Laville et al., "Integrated Offset Trimming Technique", 27th European Solid-State Circuits Conference, Sep. 2001, 4 pgs.

Actel, Reliability Considerations For Automotive FPGAs, White Paper, Sep. 2003, 17 pgs.

MRAM Redundancy Scheme (prior art available prior to filing date of the present application).

* cited by examiner

APPARATUS AND METHODS FOR PROVIDING REDUNDANCY IN INTEGRATED CIRCUITS

TECHNICAL FIELD

The inventive concepts relate generally to providing redundancy in integrated circuits (IC) and, more particularly, to providing redundancy in ICs by using programmable elements.

BACKGROUND

Modern ICs are often relatively complex. The trends in semiconductor design and manufacturing point to increased complexity of ICs in the future. Although manufacturers strive for, and make, continued improvement in the fabrication processes of ICs, defects occur nevertheless. As a consequence of the defects, manufacturing yields decrease. Because complex IC dies have a relatively high cost to design and manufacture, even a relatively small decrease in yield can prove costly.

To reduce the negative impact of defects on yield, designers sometimes include redundancy features in ICs. Through redundancy, one may substitute an operational block or circuit for a defective one. Conventional approaches to providing redundancy, however, introduce additional complexity themselves. A need therefore exists for providing cost-effective redundancy in ICs.

SUMMARY

The inventive concepts disclosed here relate to apparatus and associated methods for providing cost-effective redundancy in ICs. One may apply techniques according to the invention to a variety of ICs, such as programmable logic devices (PLDs).

One aspect of the invention concerns apparatus for providing redundancy in ICs. In one illustrative embodiment, an IC includes redundancy circuitry that provides a redundancy feature for the IC by using a decoder. The decoder decodes defect information received from a set of circuit elements. The decoded information is used to provide redundancy in the IC.

As noted, the IC may constitute a variety of devices. Thus, in a second exemplary embodiment according to the invention, the IC constitutes a PLD.

In a third exemplary embodiment according to the invention, a PLD includes a main block of memory, a plurality of programmable fuses, a decoder, a redundancy circuit, and a redundant block of memory. The fuses provide a set of coded signals that correspond to a defect in the main block of memory. The decoder circuit derives a decoded set of signals from the coded set of signals.

The redundancy circuit couples to the decoder and responds to the decoded set of signals. The redundant memory block couples to the redundancy circuit. The redundant memory block is used to provide redundancy for the main memory block. As a result of the redundancy, from the user's perspective, the main block of memory appears to lack the defect.

Another aspect of the invention concerns methods of providing redundancy in an IC. In one illustrative embodiment, a method according to the invention includes retrieving information about a defect in the IC. The information about the defect is coded in the IC. The method also includes decoding the information about the defect to identify a defective circuit within the IC, and using a redundant circuit within the IC instead of the identified defective circuit.

BRIEF DESCRIPTION OF THE DRAWINGS

The appended drawings illustrate only exemplary embodiments of the invention and therefore should not be considered as limiting its scope. Persons of ordinary skill in the art who have the benefit of the description of the invention appreciate that the disclosed inventive concepts lend themselves to other equally effective embodiments. In the drawings, the same numeral designators used in more than one drawing denote the same, similar, or equivalent functionality, components, or blocks.

DETAILED DESCRIPTION

This invention contemplates apparatus and associated methods for providing cost-effective redundancy in a variety of ICs, such as PLDs, as desired. The inventive concepts help to improve manufacturing yield in a relatively cost-effective manner.

More specifically, and as described below in detail, the inventive concepts contemplate using a decoder circuit together with programmable elements that include redundancy information about a given IC. The decoder allows the use of relatively few programmable elements, which in turn results in decreased costs, improved reliability, and higher manufacturing yields. Moreover, the redundancy scheme according to the invention is transparent to the end-user.

Put another way, from an external point of view, an IC that includes redundancy according to the invention can behave in the same manner as an IC that does not include such redundancy. Using the techniques according to the invention, however, provides the benefits noted above (i.e., improved reliability, lower costs, and improved manufacturing yields).

Figure 1:
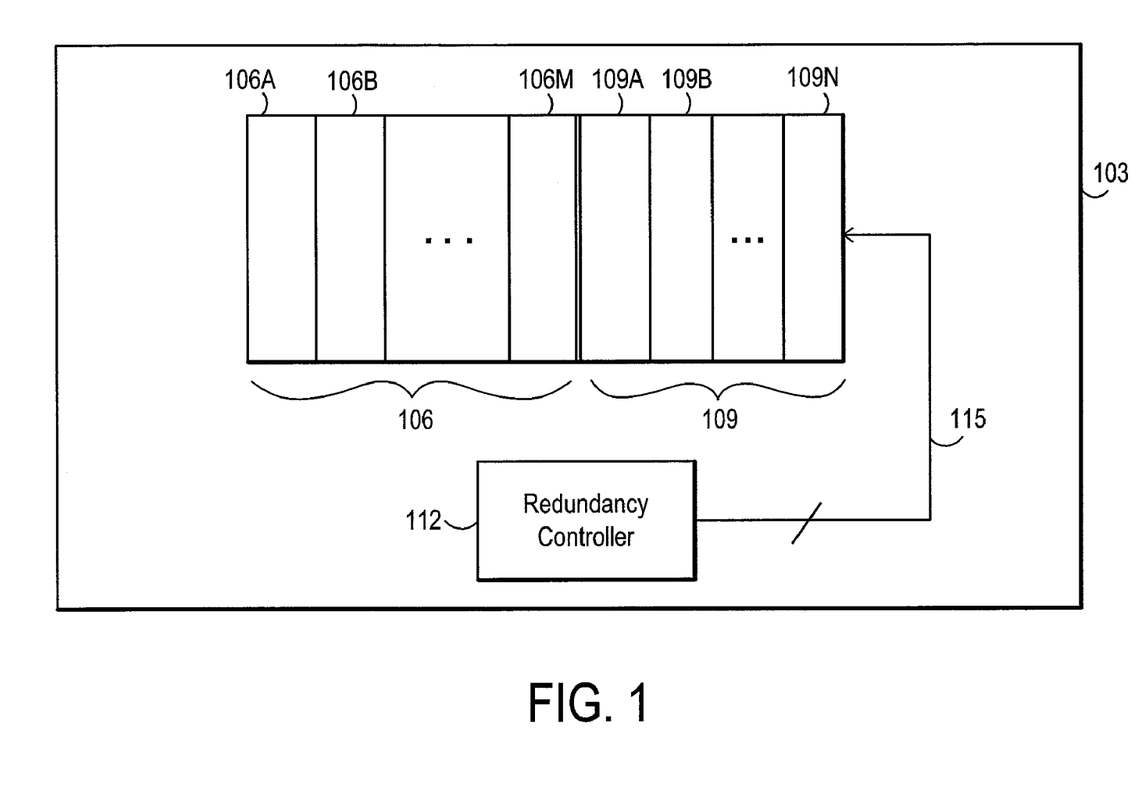
FIG. 1 shows a partial block diagram of an IC that includes a redundancy scheme according to an exemplary embodiment of the invention.

FIG. 1 shows a partial block diagram of an IC 103 that includes a redundancy scheme according to an exemplary embodiment of the invention. IC 103 includes circuit blocks 109A-109N and one or more redundant circuit blocks 106A-

106M. Note that M and N constitute positive integer numbers. More specifically, M denotes the number of redundant circuit block(s) in IC 103, whereas N denotes the number of circuit blocks for which redundant circuit blocks 106A-106M provide a redundancy feature.

One may use a wide range of numbers M and N, depending on factors such as the level of redundancy desired, the number of circuit blocks desired for a particular application or implementation, targeted or desired cost and/or complexity of IC 103. Those factors and other factors depend on design and performance specifications for a given application, as persons of ordinary skill in the art who have the benefit of the description of the invention understand.

Together, circuit blocks 109A-109N and redundant circuit block(s) 106A-106M provide the building blocks for a redundancy scheme for IC 103. IC 103 also includes redundancy controller 112, which controls the provision of redundancy according to the inventive concepts.

Circuit blocks 109A-109N may constitute a wide variety of circuitry, as desired. For example, each of circuit blocks 109A-109N may constitute a memory block, a block of logic circuitry, input/output circuitry, control circuitry, and the like. The choice of circuit blocks 109A-109N depends on the particular features of each application, as persons of ordinary skill in the art with the benefit of the description of the invention understand.

Generally, each of redundant circuit block(s) 106A-106M includes a replica of one of circuit blocks 109A-109N. For example, assume that each of circuit blocks 109A-109N constitutes a memory block of 512 bytes (i.e., a 512 byte by 1 byte memory block). Each of redundant circuit block(s) 106A-106M also constitutes a memory block of 512 bytes. As persons of ordinary skill in the art who have the benefit of the description of the invention understand, however, one may include other circuitry (for example, redundancy support circuitry that operates in conjunction with redundancy controller 112) within redundant circuit block(s), as desired.

The number of redundant circuit block(s) 106A-106M depends on a number of factors that persons skilled in the art with the benefit or the description of the invention understand. Such factors include the desired level of redundancy for IC 103, cost of IC 103, complexity of IC 103, manufacturing yield, etc.

Generally, the larger the number of redundant circuit block(s) 106A-106N, the higher the level of redundancy in IC 103. For instance, including one redundant circuit block (e.g., redundant circuit block 106A) allows providing redundancy of one of circuit blocks 109A-109M. Increasing the number of redundant circuit blocks beyond one results in a corresponding increase in the level of redundancy provided in IC 103.

In the extreme, one may include as many redundant circuit blocks 106A-106N in IC 103 as circuit blocks 109A-109M (i.e., M=N). Doing so increases the level of redundancy for IC 103 and, hence, improved the manufacturing yield. On the other hand, in such a situation, the complexity of providing the redundancy (and hence the cost of IC 103) also increases. Thus, in a given or desired implementation, one may trade off the various factors (e.g., cost, complexity, level of redundancy). The trade-off for each situation depends on design and performance considerations for that particular situation, as persons of ordinary skill in the art who have the benefit of the description of the invention understand.

As described below in more detail, redundancy controller 112 controls the provision of redundancy for IC 103. Redundancy controller 112 communicates with circuit blocks 109A-109N and redundant circuit block(s) 106A-106M via signal link 115. Generally, signal link 115 may include one or more signal conductors for communicating data, status, and command signals.

More specifically, redundancy controller 112 supervises the functional replacement of one of circuit blocks 109A-109N with one of redundancy circuit block(s) 106A-106M. Put another way, suppose that testing of IC 103 identifies one of circuit blocks 109A-109N as defective (e.g., a stuck-at fault in one of the circuits in the blocks, thus rendering it inoperable). One may use redundancy controller 112 to functionally replace the defective circuit block, say, circuit block 109A, with one of redundancy circuit block(s), say, block 106A.

Thus, redundancy circuit block 106A receives the signals that defective circuit block 109A would receive (if it were a functional circuit block). In effect, the redundancy scheme bypasses defective circuit block 109A and instead uses redundant circuit block 106A. As a result, IC 103 can be configured as a fully functioning IC, rather than scrapped as a defective unit, which results in improved manufacturing yields.

Figure 2:
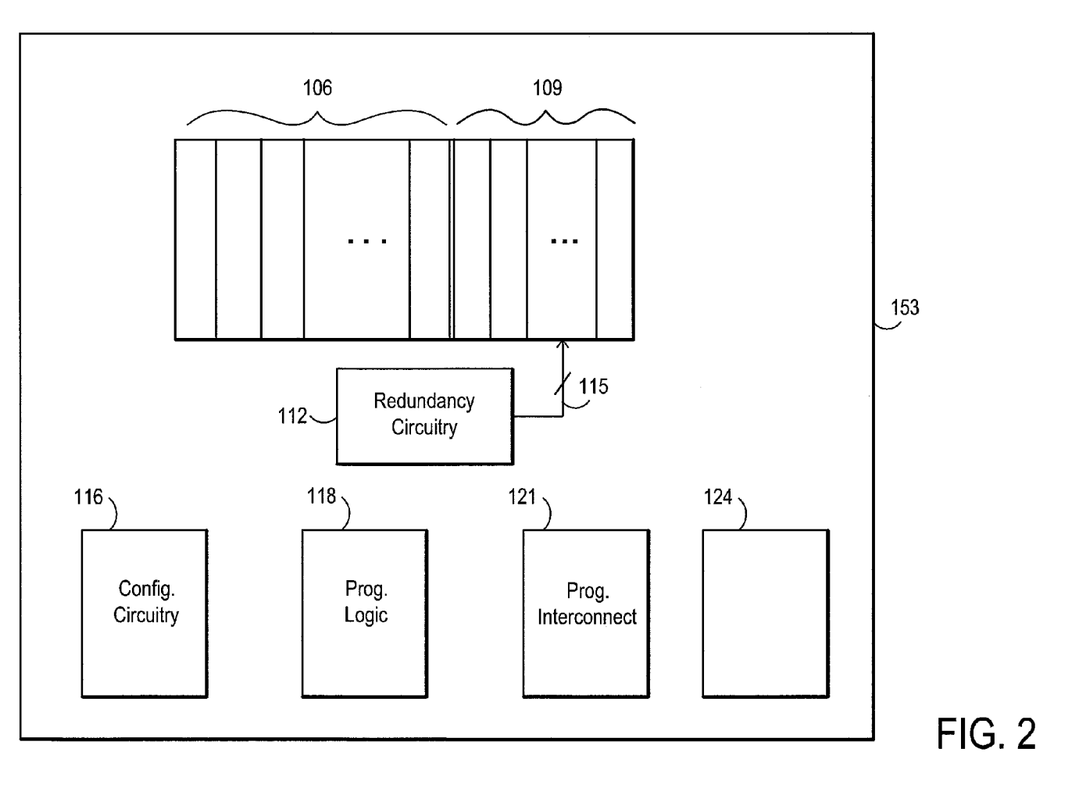
FIG. 2 illustrates a block diagram of another IC according to an exemplary embodiment of the invention, which includes a redundancy scheme.

FIG. 2 illustrates a block diagram of another IC according to an exemplary embodiment of the invention, which includes a redundancy scheme. More particularly, FIG. 2 depicts a particular kind of IC, a programmable logic device (PLD) 153, which provides programmable or configurable functionality.

Similar to IC 103 in FIG. 1, PLD 153 includes circuit blocks 109A-109N, redundant circuit block(s) 106A-106M, and redundancy controller 112. PLD 153 may also include configuration circuitry 116, programmable logic circuitry 118, and programmable interconnect circuitry 121. Additionally, PLD 153 may include one or more data processing block or hardware 124. Data processing block or hardware 124 may constitute one or more of a processor, communications circuitry, test circuitry, debug circuitry, memory controllers, and the like, as persons of ordinary skill in the art who have the benefit of the description of the invention understand.

Note that FIG. 2 shows a simplified block diagram of PLD 153. Thus, PLD 153 may include other blocks and circuitry, as persons of ordinary skill in the art understand. Examples of such circuitry include clock generation and distribution circuits, input/output (I/O) circuitry, clock generation and distribution circuitry, control and timing circuitry, and the like.

Programmable logic circuitry 118 includes blocks of configurable or programmable logic circuitry, such as look-up tables (LUTs), product-term logic, multiplexers, logic gates, registers, memory, and the like. Programmable interconnect circuitry 121 couples to programmable logic circuitry 118 and provides configurable interconnects (coupling mechanisms) among various blocks within programmable logic circuitry 118 and other circuitry within or outside PLD 153, as desired.

PLD configuration circuitry 116 uses configuration data to program or configure the functionality of PLD 153. The configuration data determine the functionality of PLD 153. More specifically, PLD 153 uses the configuration data to program or configure programmable logic circuitry 115, programmable interconnect circuitry 121 (and other parts of PLD 153, as desired), as persons skilled in the art with the benefit of the description of the invention understand. Configuration circuitry 118 obtains the configuration data from a configuration device (not shown explicitly), as persons of ordinary skill in the art who have the benefit of the description of the invention understand.

The redundancy technique in PLD 153 operates similar to the redundancy scheme described above in connection with IC 103 (see FIG. 1). Note that circuit blocks 109A-109N (and, hence, corresponding redundant circuit block(s) 106A-106M) may constitute a wide variety of circuitry in PLD 153. For example, they may constitute memory circuitry or blocks, part or all of programmable logic circuitry 118 or programmable interconnect circuitry 121, etc.

Moreover, one may extend the redundancy techniques to more than one type of block or circuitry in PLD 153 (and in IC 103 in FIG. 1). Thus, by providing additional circuitry and by making modifications that fall within the knowledge of persons skilled in the art with the benefit of the description of the invention, one may provide redundancy for part or all of programmable logic circuitry 118, programmable interconnect circuitry 121, and/or other circuitry within PLD 153, as desired.

Note that one may apply the inventive concepts effectively to various programmable circuitry or ICs known by other names in the art, as desired, and as persons skilled in the art with the benefit of the description of the invention understand. Such circuitry include devices known as complex programmable logic device (CPLD), programmable gate array (PGA), and field programmable gate array (FPGA).

Figure 3:
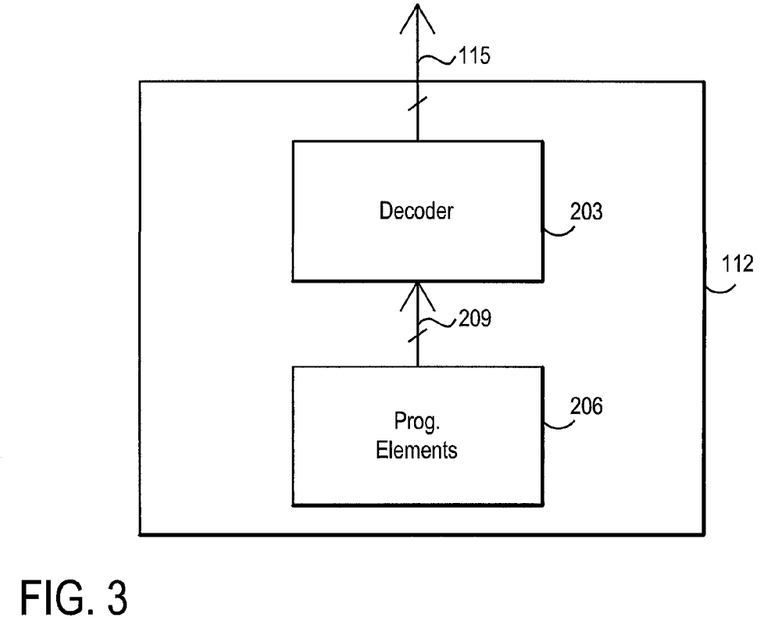
FIG. 3 depicts a block diagram of redundancy controller according to an illustrative embodiment of the invention that includes a decoder.

As noted above, the redundancy scheme according to the invention uses programmable elements. FIG. 3 depicts a block diagram of redundancy controller 112 according to an illustrative embodiment of the invention. Redundancy controller 112 includes programmable elements 206, signal link 209, and decoder 203.

Programmable elements 206 supply information used to provide redundancy in an IC according to the invention. More specifically, and as noted above, during a test phase, one identifies any circuit defects in the IC. By programming or configuring programmable elements 206, one stores information about the defect(s) in the IC. Redundancy controller 112 uses that information to provide circuit redundancy in the IC and, thus, overcome the defect by essentially bypassing the defective circuit block(s).

In exemplary embodiments according to the invention, programmable elements 206 supply coded redundancy information to decoder 203 via signal link 209. Signal link 209 includes a number of signal conductors (e.g., IC metal traces). Decoder 203 decodes the redundancy information that it receives from programmable elements 206. At its output, decoder 203 provides a number of signals via signal link 115. As described above, the signals present in signal link 115 accomplish the bypassing of defective circuit block(s) and, hence, the provision of redundancy in the IC.

Figure 4:
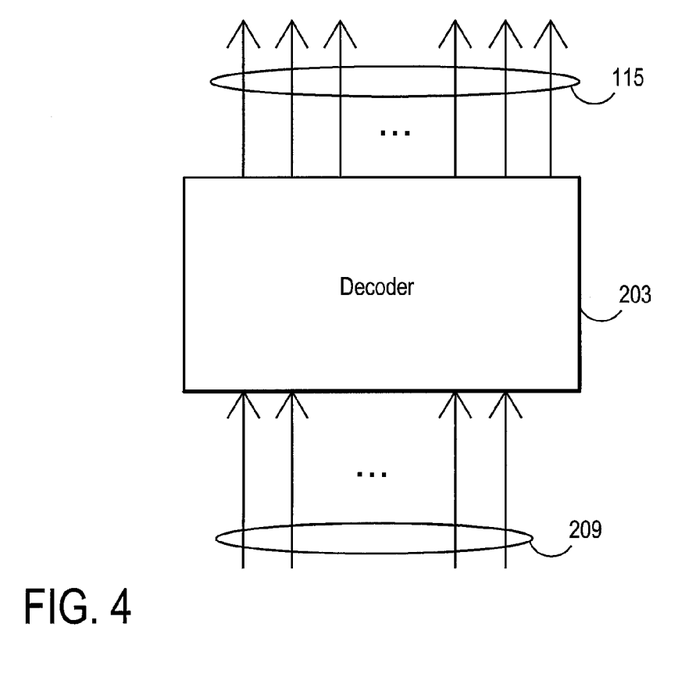
FIG. 4 a block diagram of a decoder for use in redundancy controllers according to the invention.

FIG. 4 shows a block diagram of a decoder 203 for use in redundancy apparatus according to the invention. Decoder 203 receives a plurality of signals via signal link 209. In exemplary embodiments, signal link 209 includes, say, K signals. Each signal in the plurality of K signals may constitute a binary signal provided by programmable elements 206 (not shown explicitly in FIG. 4).

At its output, decoder 203 provides up to and including $2^K$ signals. In other words, in the general case, decoder 203 decodes the K binary signals at its input and provides $2^K$ binary signals as its output. Note that one need not use the maximum number of output signals. For example, K=8 would enable decoder 203 to generally provide $2^8$ or 256 output signals. Depending on the application and design and performance specifications, one may use a subset of those 256 possible signals, for example, 144 signals, as desired.

Figure 5:
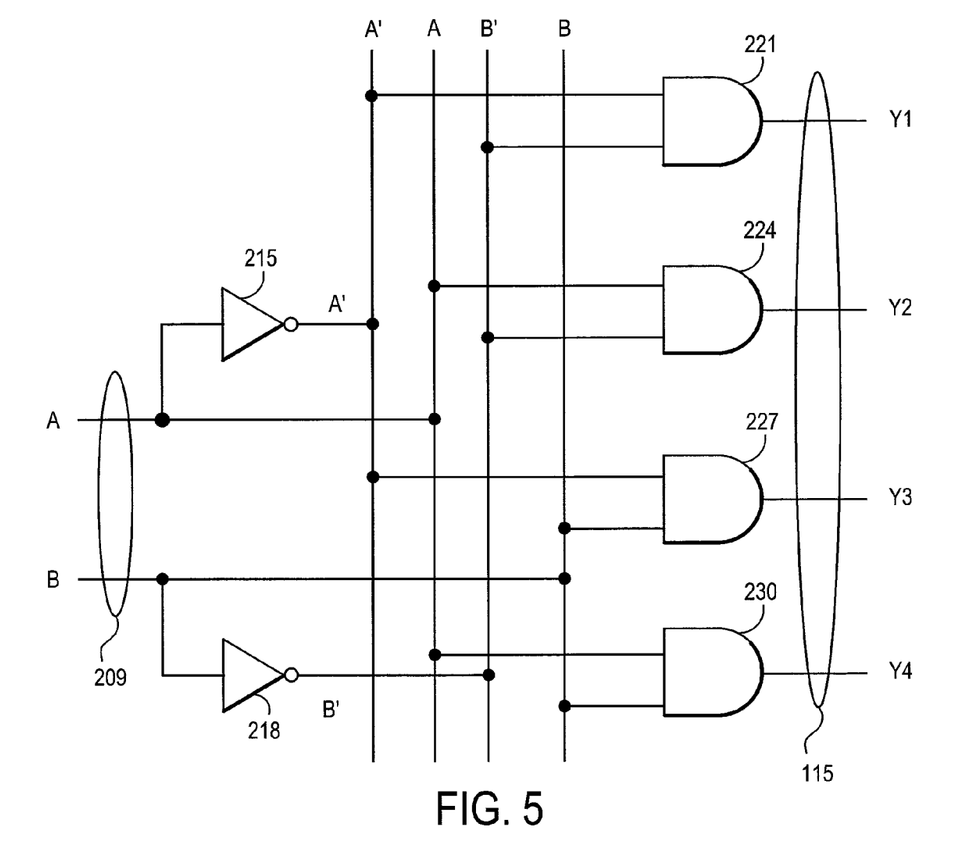
FIG. 5 a schematic diagram of a decoder according to an exemplary embodiment of the invention.

FIG. 5 shows a schematic diagram of a decoder according to an exemplary embodiment of the invention. The decoder includes inverter 215, inverter 218, and AND gates 221, 224, 227, and 230.

The decoder in FIG. 5 accepts a 2-bit input (i.e., input signals A and B), decodes those input signals, and provides four output signals, $Y_1$, $Y_2$, $Y_3$, and $Y_4$. A detailed description of the operation of the decoder follows.

Inverter 215 receives input A and produces its complement, A'. Similarly, inverter 218 receives input B and produces its complement, B'. AND gates 221, 224, 227, and 230 produce outputs $Y_1$, $Y_2$, $Y_3$, and $Y_4$ according to the following Boolean equations:

$Y_1 = A'B'$, $Y_2 = AB'$, $Y_3 = A'B$, and $Y_4 = AB$.

Put another way, each of outputs $Y_1$, $Y_2$, $Y_3$, and $Y_4$ constitutes a unique Boolean combination of inputs A and B and their complements, i.e., A' and B'. As noted above, however, depending on a particular application or implementation, one need not use all possible combinations available.

Note that the circuitry shown in FIG. 5 constitutes merely an illustrative schematic diagram of a decoder for use in exemplary embodiments of the invention. As persons of ordinary skill in the art who have the benefit of the description of the invention understand, one may use other circuits to implement decoders according to the invention. Furthermore, depending on factors such as design and performance specifications for a particular application or implementation, one may use different numbers of inputs and outputs, as desired.

Figure 6:
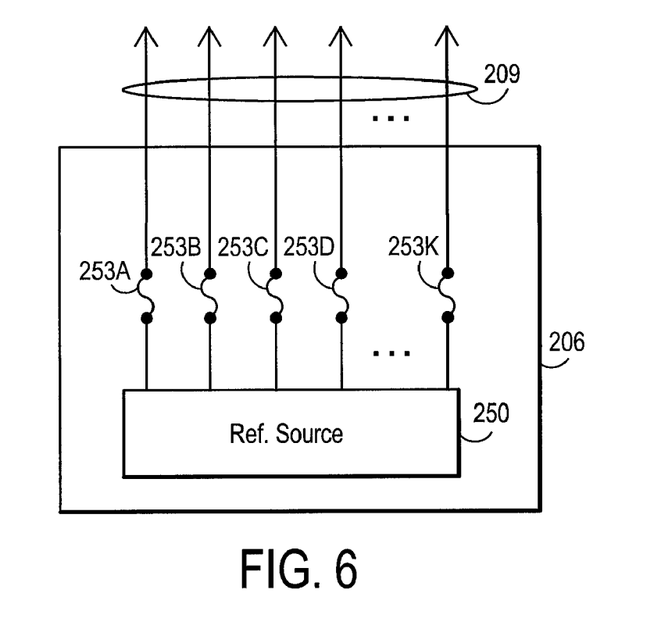
FIG. 6 illustrates a circuit arrangement for using programmable elements to provide coded redundancy signals in an exemplary embodiment according to the invention.

As noted above, decoder 203 (see FIG. 3) receives its input signals from programmable elements 206 via signal link 209. FIG. 6 illustrates a circuit arrangement for using programmable elements to provide coded redundancy signals in an exemplary embodiment according to the invention.

The circuit arrangement in FIG. 6 includes electrical fuses 253A-253K. The number of the electrical fuses depends on the level of redundancy one desires to provide, as persons of ordinary skill in the art who have the benefit of the description of the invention understand.

Each of electrical fuses 253A-253K may constitute an electrical fuse within an IC that one may program. For example, each of electrical fuses 253A-253K may constitute a laser-programmable fuse or an electrical fuse. An example of an electrical fuse appears in U.S. patent application Ser. No. 10/455,083, titled "Apparatus and Methods for Electrical Fuses in Integrated Circuits," and filed on Jun. 5, 2003. The choice of the type of fuse depends on a number of factors that fall within the knowledge of persons skilled in the art with the benefit of the description of the invention, such as design and performance specifications and available IC fabrication technology.

One programs the fuses depending on the particular of fuse technology used. Conceptually, one blows or electrically opens a fuse by using various techniques (e.g., by using a laser beam or by using an electrical current) to program it. Thus, generally, a programmed fuse constitutes an electrical open circuit, whereas an unprogrammed fuse provides an electrical connection between its terminals.

Reference source 250 provides one or more voltage or current signals (e.g., the supply voltage, ground potential, etc.) to signal link 209 via fuses 253A-253K. Thus, depending on the programming state of fuses 253A-253K, voltage or current signals appear on the electrical conductors in signal link 209. The signals that signal link 209 provide constitute coded redundancy signals used to provide redundancy within the IC in which fuses 253A-253K reside.

As an example, suppose that reference source 250 provides a logic high signal to fuse 253A. Assume further that, depending on the defect(s) detected during the testing of the IC within which fuses 253A-253K reside, one has chosen to not program fuse 253A (i.e., fuse 253A provides an electrical connection between its two terminals). As a result, a logic high signal appears on the electrical conductor within signal link 209 that corresponds to fuse 253A.

Figure 7:
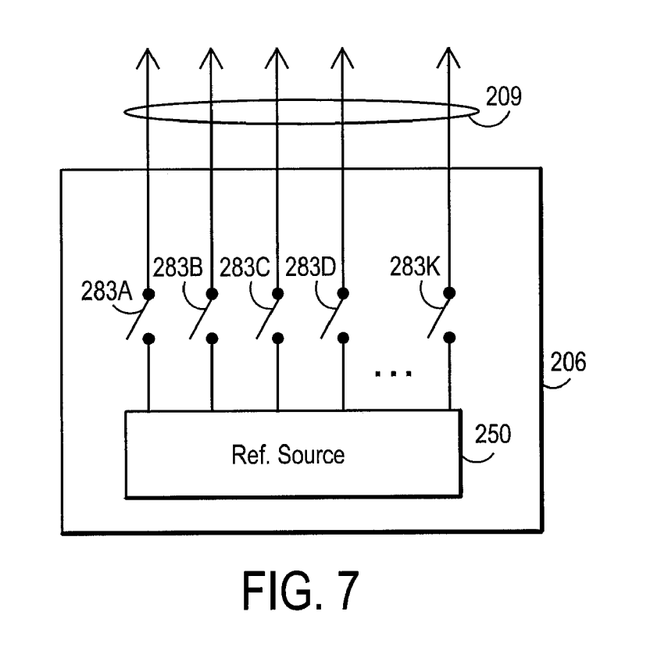
FIG. 7 another circuit arrangement for using programmable elements to provide coded redundancy signals in an exemplary embodiment according to the invention.

FIG. 7 depicts another circuit arrangement for using programmable elements to provide coded redundancy signals in an exemplary embodiment according to the invention. The circuit arrangement in FIG. 7 includes reference source 250 and switches 283A-283K.

Reference source 250 provides a similar function as the reference source described above in connection with FIG. 6. Switches 283A-283K constitutes programmable electrical switches. For example, switches 283A-283K may constitute metal traces within an IC. During the manufacture of the IC, one may partially fabricate the IC, test the fabricated circuitry to detect any defects, and then use the mask layer(s) corresponding to one or more metal layers to implement and program switches 283A-283K. Regardless of their particular implementation, switches 283A-283K provide a similar functionality to fuses 253A-253K, described above.

Note that the fuses and switches described here constitute merely examples of programmable elements for use according to the invention. As persons of ordinary skill in the art who have the benefit of the description of the invention understand, one may use other types of programmable elements, as desired. The choice of programmable element depends on factors such as existing or available technology at the time of implementation and design and performance specifications. Thus, one may use presently existing technology or technology that becomes available in the future, as desired.

Figure 8:
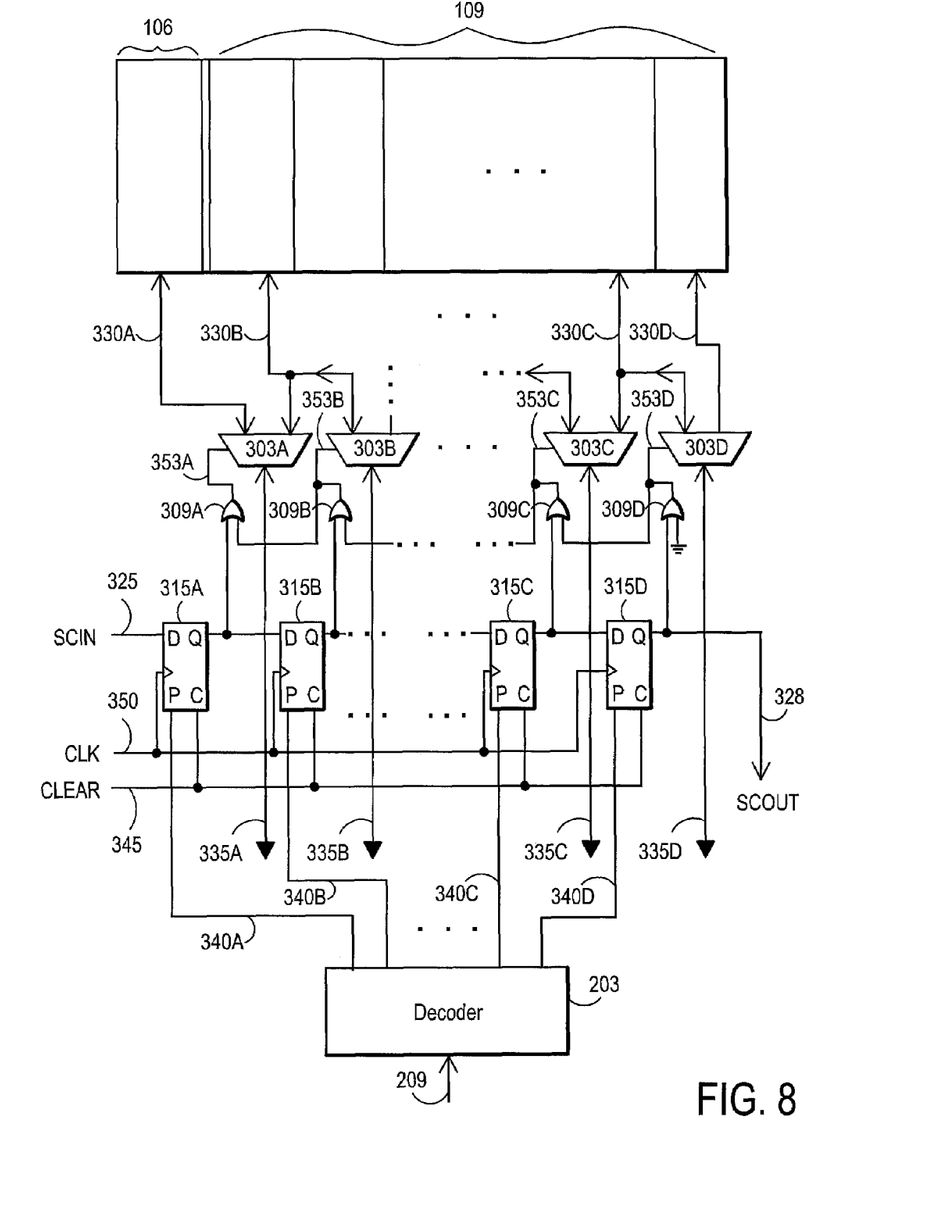
FIG. 8 a circuit arrangement of a part of an IC that includes a redundancy scheme according to an exemplary embodiment of the invention.

FIG. 8 shows a circuit arrangement of a part of an IC that includes a redundancy scheme according to an exemplary embodiment of the invention. The circuit arrangement in FIG. 8 includes circuit blocks 109, at least one redundant circuit block 106, multiplexers (MUXs) 303A-303D, OR gates 309A-309D, flip-flops or registers 315A-315D, and decoder 209.

Decoder 209, circuit blocks 109, and redundant circuit block(s) 106 perform function similar to the functions described above in connection with other figures. In other words, decoder 203 receives coded redundancy information from programmable elements (not shown in FIG. 8) via signal link 209. Circuit block 109, together with redundant circuit block(s) 106, provide redundancy for the IC in which the circuit arrangement in FIG. 8 resides.

Decoder 203 decodes that information to derive redundancy signals that it uses to program flip-flops 315A-315D. More specifically, decoder 203 provides its outputs signals to flip-flops 315A-315D via signal lines 340A-340D, respectively. More specifically, each of signal lines 340A-340D couples to a corresponding preset input of one of flip-flops 315A-315D. Thus, signal line 340A couples to the preset input of flip-flop 315A, signal line 340B couples to the preset input of flip-flop 315B, and so forth.

A clear signal line 345 (labeled "CLEAR") couples to the clear input of each of flip-flops 315A-315D. A clear signal applies to clear signal line 345 clears the outputs of flip-flops 315A-315D. A clock signal line 350 (labeled "CLK") couples to the clear input of each of flip-flops 315A-315D and synchronously clocks the flip-flops.

Flip-flops 315A-315D couple in a cascade arrangement. More specifically, the D input of each of flip-flops 315B-315D receives the Q output of the preceding flip-flop. For example, the D input of flip-flop 315D receives the Q output of flip-flop 315C, whereas the Q output of flip-flop 315A couples to the D input of flip-flop 315B. Thus, conceptually, flip-flops 315A-315D act as a shift-register in response to the clock signals applied via clock signal line 350.

The D input of the first flip-flop in the chain, i.e., flip-flop 315A, receives an SCIN signal via signal line 325. The Q output of the last flip-flop, i.e., flip-flop 315D, provides an SCOUT signal via signal line 328. Signals SCIN and SCOUT constitute, respectively, input and output signals for scan chain testing. Scan chain testing allows the testing of circuitry within an IC. The details of scan chain testing fall within the knowledge of persons of ordinary skill in the art.

The Q output of each of flip-flops 315A-315D feeds one input of a respective one of OR gates 309A-309D. The output of a succeeding OR gate feeds a second input of each of OR gates 309A-309C. For example, the output of OR gate 309B feeds the second input of OR gate 309A, and so forth. The second input of the last OR gate, i.e., OR gate 309D, couples to ground, or logic low.

The output of each of OR gates 309A-309D couples to the select input (labeled as signal lines 353A-353D, respectively) of a corresponding one of MUXs 303A-303D. Thus, the output of OR gate 309A feeds the select input of MUX 303A via signal line 353A, the output of OR gate 309B feeds the select input of MUX 303B via signal line 353B, and so on.

MUXs 303A-303D may allow uni-directional or bi-directional flow of signals, as desired, and depending on the details of a particular implementation. Thus, the terms input and output used here are merely for convenience and do not denote the direction of the flow of signals. In the general case, MUXs 303A-303D have input/output terminals to denote their bi-directional nature although, as noted, one may use uni-directional MUXs, as desired.

The choice of signal flow in MUXs 303A-303D depends on the nature of circuit blocks 109 and redundant circuit block(s) 106. If circuit blocks 109 and redundant circuit block(s) 106 provide bi-directional flow of information (i.e., over a shared signal link or interface), then one may use bi-directional MUXs; otherwise, one may use uni-directional MUXs, as desired. In a complementary metal oxide semiconductor (CMOS) implementation, MUXs 303A-303D are bi-directional in nature.

Circuit blocks 109 and redundant circuit block(s) 106 couple to MUXs 303A-303D via signal lines 330A-330D. Through signal lines 330A-330D, circuit blocks 109 and redundant circuit block(s) 106 may communicate with MUXs 303A-303D. More specifically, signal lines 330A-330D allow the provision of information from MUXs 303A-303D to circuit blocks 109 and redundant circuit block(s) 106, vice-versa, or both (i.e., a bi-directional flow of information).

In an exemplary application, each of circuit blocks 109 and redundant circuit block(s) 106 may constitute a memory block. For example, each memory block may include 512 bytes of memory organized in a column. The memory blocks may provide read information and receive write information over a shared set of signal lines, as desired. Persons of ordinary skill in the art who have the benefit of the description of the invention appreciate that one may use other memory arrangements, and that, rather than memory circuits, one may substitute other types of circuitry, as desired.

Signal lines 330A-330D provide one input/output to a respective one of MUXs 303A-303D. For example, signal line 330A couples to MUX 303A, and so on. Each of signal lines 330B-330D also serves as a second input/output to a respective one of MUXs 303A-303D. As an example, signal line 330B couples to one input/output of MUX 303B, which also couples one input/output of MUX 303A.

A third input/output of each of MUXs 303A-303D, labeled as signal lines 335A-335D, respectively, provides a mechanism for coupling to, and communicating with, one of circuit blocks 109 and redundant circuit block(s) 106. Through signal lines 335A-335D, one may provide information to, or receive information from, one of circuit blocks 109 or redundant circuit block(s) 106.

As an example, referring to the particular embodiment in FIG. 8, consider the situation where each of circuit blocks 109 (and, hence, each of redundant circuit block(s) 106) constitutes a memory block. Through MUX 303A and signal line 335A, one may provide write data to redundant circuit block 106 (i.e., a memory block) or receive read data from redundant circuit block 106.

Using the circuit arrangement shown in FIG. 8, one may provide a redundancy feature for an IC according to the invention. In other words, one or more of redundant circuit block(s) 106 provides the functionality of one or more defective circuit blocks 109. As a consequence, to the user of the IC, it does not appear to have a defect.

As an example for the particular embodiment shown in FIG. 8, consider the situation where testing of the IC indicates that none of circuit blocks 109 has a defect. At the outset, asserting clear signal line 345 causes flip-flops 315A-315D to clear. The programmable elements provide the coded defect (none in this example) or redundancy information to decoder 203 via signal link 209. Decoder 203 decodes that information to determine which of flip-flops 315A-315D to preset.

Because none of the circuit blocks 109 has a defect, all preset inputs to flip-flops de-assert. Consequently, none of flip-flops 315A-315D presets in response to the application of clock signals. The logic low outputs of flip-flop 315D causes OR gate 309D to have a logic low output because both of its inputs have logic low values.

As a result of the logic low output of OR gate 309D and the logic low output of flip-flop 315C, OR gate 309C will also have a logic low output. Through similar mechanisms, each of OR gates 309A-309B will have logic low values at both of its inputs and, consequently, at its output.

As a result of the logic low values at the outputs of OR gates 309A-309D, MUXs 303A-303D cause no shifting of the input/output signals to redundant circuit block 106 and circuit blocks 109. Put another way, logic low values on select signal lines 353A-353D cause MUXs 303A-303D to couple circuit blocks 109 to input/output signal lines 335A-335D. More specifically, MUX 303A couples the left-most circuit block to input/output signal line 335A, MUX 303B couples the next circuit block to input/output signal line 335B, and so on.

As another example, consider the situation where the left-most circuit block in circuit blocks 109 has a defect. Again, one programs the programmable elements (not shown explicitly in FIG. 8) in the IC to reflect or code that defect. Decoder 203 decodes the defect or redundancy information to determine which of flip-flops 315A-315D to preset.

In this particular example, decoder 203 causes a logic high value to appear on signal line 340A. As a result, the Q output of flip-flop 315A presets, whereas flip-flops 315B-315D do not preset. Because of the logic low values at the Q outputs of flip-flops 315B-315D, each of OR gates 309B-309D has logic low values at its inputs and, hence, a logic low value at its output. As a consequence, each of MUXs 309B-309D couples a respective one of circuit blocks 109 to one of input/output signal lines 335B-335D.

The logic high value at the Q output of flip-flop 315A, however, causes OR gate 309A to have a logic high value at its output. As a result, select signal line 353A has a logic high value, which causes MUX 303A to couple redundant circuit block 106, rather than the left-most circuit block of circuit blocks 109, to input/output signal lines 335A. Thus, redundant circuit block 106 provides the functionality of the defective circuit block. From the user's perspective, the IC appears to have no defect because of the redundancy feature according to the invention.

Note that the circuit arrangement in FIG. 8 corresponds to merely one exemplary embodiment, and that one may use other numbers of redundant circuit block(s) 106 and circuit blocks and, hence, other numbers of OR gates, MUXs, and flip-flops. The details of the circuit arrangement for a particular embodiment depend on factors such as the design and performance specifications of each implementation or application, as persons skilled in the art with the benefit of the description of the invention understand.

Figure 9:
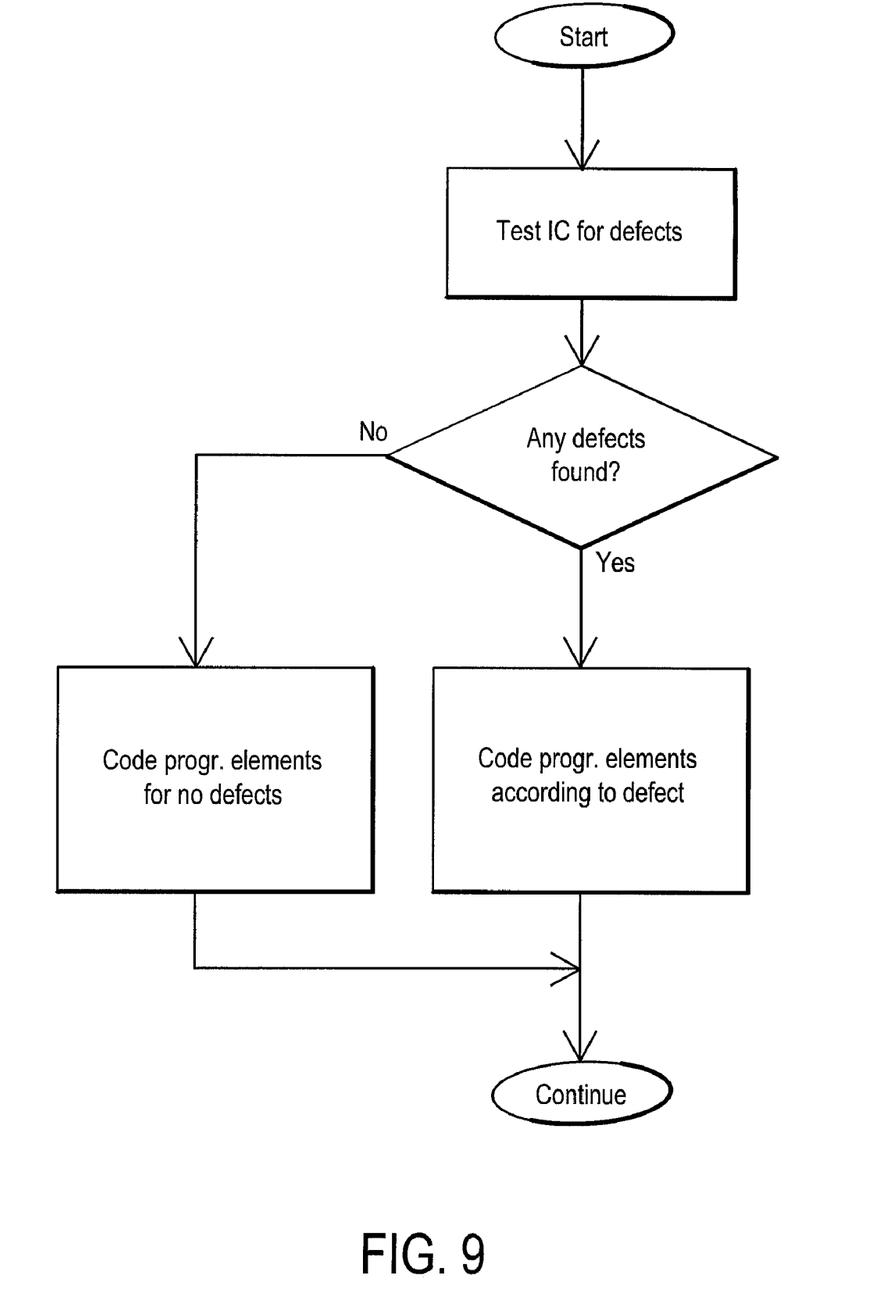
FIG. 9 an illustrative flow diagram for programming or configuring the programmable elements used in exemplary embodiments of the invention in conjunction with the decoder circuitry.

FIG. 9 depicts an illustrative flow diagram for programming or configuring the programmable elements used in exemplary embodiments of the invention in conjunction with the decoder circuitry. One begins by testing the IC that includes a redundancy feature according to the invention.

If the testing discovers one of more defects, one configures or programs the programmable elements according to the detected defect(s). As noted above, because of the use of coding, the number of programmable elements and signal lines provided to the decoder circuitry decrease and, hence, result in less circuit complexity and cost.

On the other hand, if the testing detects no defects, one codes or programs the programmable elements to indicate the lack of any defects. The decoder circuitry receives and decodes the defect or redundancy information and uses that information to provide redundancy for the IC, as appropriate.

Referring to the figures, persons of ordinary skill in the art will note that the various blocks shown may depict mainly the conceptual functions and signal flow. The actual circuit implementation may or may not contain separately identifiable hardware for the various functional blocks and may or may not use the particular circuitry shown.

For example, one may combine the functionality of various blocks into one circuit block, as desired. Furthermore, one may realize the functionality of a single block in several circuit blocks, as desired. The choice of circuit implementation depends on various factors, such as particular design and performance specifications for a given implementation, as persons of ordinary skill in the art who have the benefit of the description of the invention understand.

Other modifications and alternative embodiments of the invention in addition to those described here will be apparent to persons of ordinary skill in the art who have the benefit of the description of the invention. Accordingly, this description teaches those skilled in the art the manner of carrying out the invention and are to be construed as illustrative only.

The forms of the invention shown and described should be taken as the presently preferred or illustrative embodiments. Persons skilled in the art may make various changes in the shape, size and arrangement of parts without departing from the scope of the invention described in this document. For example, persons skilled in the art may substitute equivalent elements for the elements illustrated and described here. Moreover, persons skilled in the art who have the benefit of this description of the invention may use certain features of the invention independently of the use of other features, without departing from the scope of the invention.

We claim:

1. An integrated circuit (IC) including redundancy circuitry configured to provide redundancy by using a decoder circuitry coupled to a scan chain, wherein the decoder circuitry is configured to decode coded defect information received from a set of circuit elements to generate decoded defect information, and to provide in parallel the decoded defect information to the scan chain.

2. The integrated circuit (IC) according to claim 1, wherein the redundancy circuitry is further configured to provide redundancy by bypassing a defective circuit block within the integrated circuit (IC).

3. The integrated circuit (IC) according to claim 2, wherein the redundancy circuitry is further configured to provide redundancy by using a redundant circuit block to perform the functionality of the bypassed defective circuit block.

4. The integrated circuit (IC) according to claim 1, wherein the redundancy circuitry is further configured to provide redundancy for a plurality of circuit blocks within the integrated circuit (IC).

5. The integrated circuit (IC) according to claim 4, wherein the set of circuit elements comprise a plurality of programmable circuit elements.

6. The integrated circuit (IC) according to claim 5, wherein a number of the plurality of programmable circuit elements is smaller than the number of the circuit blocks in the plurality of circuit blocks.

7. The integrated circuit (IC) according to claim 5, wherein each of the programmable circuit elements comprises an electrically programmed fuse.

8. The integrated circuit (IC) according to claim 5, wherein each of the programmable circuit elements comprises a laser-programmed fuse.

9. An integrated circuit (IC), comprising:
   means for providing coded signals that correspond to a defect in a defective circuitry within the integrated circuit;
   means for decoding the coded signals to generate decoded defect signals and for providing the decoded defect signals in parallel to means for storage of signals; and
   means for providing redundancy in the integrated circuit in response to the decoded defect signals.

10. The integrated circuit (IC) according to claim 9, wherein the number of decoded defect signals is larger than the number of coded signals.

11. The integrated circuit (IC) according to claim 10, wherein, in response to the decoded defect signals, the means for providing redundancy in the integrated circuit causes a redundant circuitry to be used instead of the defective circuitry.

12. The integrated circuit (IC) according to claim 11, wherein the means for providing the coded signals couples to the means for decoding the coded signals via a first signal link.

13. The integrated circuit (IC) according to claim 12, wherein the means for decoding the coded signals couples to the means for providing redundancy via a second signal link.

14. The integrated circuit (IC) according to claim 13, wherein the defective circuitry comprises a memory circuit.

15. The integrated circuit (IC) according to claim 14, wherein the redundant circuitry comprises a memory circuit.

16. The integrated circuit (IC) according to claim 15, wherein the means for providing redundancy couples to the defective circuitry via a third signal link.

17. The integrated circuit (IC) according to claim 16, wherein the means for providing redundancy couples to the redundant circuitry via a fourth signal link.

18. A programmable logic device (PLD), comprising:
   a plurality of programmable elements, the plurality of programmable elements configured to provide a first set of signals;
   a decoder circuit coupled to the plurality of programmable elements, the decoder circuit configured to derive a second set of signals from the first set of signals and to provide the second set of signals in parallel to a scan chain; and
   redundancy circuitry coupled to the decoder circuit and the scan chain,
   wherein the redundancy circuitry is responsive to the second set of signals.

19. The programmable logic device (PLD) according to claim 18, wherein the first set of signals comprises a set of signals configured to identify a defective circuit in the programmable logic device (PLD).

20. The programmable logic device (PLD) according to claim 19, wherein the set of signals configured to identify the defective circuit comprises coded signals.

21. The programmable logic device (PLD) according to claim 20, further comprising a redundant circuit, wherein, in response to the second set of signals, the redundancy circuitry causes an input signal to be coupled to the redundant circuit instead of the defective circuit.

22. The programmable logic device (PLD) according to claim 21, wherein, in response to the second set of signals, the redundancy circuitry causes an output signal of the redundant circuit to be used instead of an output signal of the defective circuit.

23. The programmable logic device (PLD) according to claim 22, wherein the coded signals correspond to information programmed in the programmable elements.

24. The programmable logic device (PLD) according to claim 18, wherein each of the programmable elements comprises a fuse.

25. The programmable logic device (PLD) according to claim 18, wherein each fuse comprises an electrically programmed fuse.

26. The programmable logic device (PLD) according to claim 18, wherein each fuse comprises a laser-programmed fuse.

27. The programmable logic device (PLD) according to claim 22, wherein the defective circuit comprises a memory circuit, and wherein the redundant circuit comprises a memory circuit.

28. The programmable logic device (PLD) according to claim 22, wherein the defective circuit comprises programmable logic circuitry, and wherein the redundant circuit comprises programmable logic circuitry.

29. The programmable logic device (PLD) according to claim 22, wherein the defective circuit comprises programmable interconnect circuitry, and wherein the redundant circuit comprises programmable interconnect circuitry.

30. A programmable logic device (PLD), comprising:
a first block of memory;
a plurality of programmable fuses, the plurality of programmable fuses configured to provide a set of coded signals corresponding to a defect in the first block of memory;
a decoder circuit configured to derive a decoded set of signals from the coded set of signals;
a scan chain coupled to the decoder circuit, the scan chain configured to receive the decoded set of signals in parallel;
redundancy circuitry coupled to the decoder circuit and the scan chain, the redundancy circuitry configured to respond to the decoded set of signals; and
a second block of memory coupled to the redundancy circuitry,
wherein the second block of memory is used to provide redundancy for the first block of memory.

31. The programmable logic device (PLD) according to claim 30, wherein each fuse in the plurality of fuses comprises an electrically programmed fuse.

32. The programmable logic device (PLD) according to claim 30, wherein each fuse in the plurality of fuses comprises a laser-programmed fuse.

33. The programmable logic device (PLD) according to claim 30, wherein the decoder comprises:
at least one inverter adapted to receive the coded signals; and
at least one AND gate coupled to the at least one inverter, wherein the at least one AND gate provides the decoded set of signals.

34. The programmable logic device (PLD) according to claim 30, wherein the redundancy circuitry further comprises a set of OR gates, wherein each OR gate in the set of OR gates couples to a respective flip-flop in the scan chain.

35. The programmable logic device (PLD) according to claim 34, wherein the redundancy circuitry further comprises a set of multiplexers, wherein each multiplexer in the set of multiplexers couples to a respective OR gate in the set of OR gates.

36. The programmable logic device (PLD) according to claim 35, wherein a first multiplexer in the set of multiplexers couples to the first block of memory.

37. The programmable logic device (PLD) according to claim 36, wherein a second multiplexer in the set of multiplexers couples to the second block of memory.

38. The programmable logic device (PLD) according to claim 30, further comprising programmable logic circuitry coupled to the second memory block.

39. The programmable logic device (PLD) according to claim 30, further comprising programmable interconnect circuitry coupled to the second memory block.

40. A method of providing redundancy in an integrated circuit (IC), the method comprising:
retrieving information about a defect in the integrated circuit (IC), wherein the information about the defect is coded in the integrated circuit (IC);
decoding the information about the defect to identify a defective circuit within the integrated circuit (IC) and to generate a set of parallel decoded signals from the information about the defect;
receiving the parallel decoded signals in a scan chain circuit; and
using a redundant circuit within the integrated circuit (IC) instead of the identified defective circuit.

41. The method according to claim 40, wherein retrieving information about a defect in the integrated circuit (IC) further comprises retrieving information coded in a set of programmable elements within the integrated circuit (IC).

42. The method according to claim 41, wherein the number of signals in the set of decoded signals is larger than the number of programmable elements in the set of programmable elements.

43. The method according to claim 41, wherein using a redundant circuit within the integrated circuit (IC) instead of the identified defective circuit further comprises bypassing the identified defective circuit.

44. The method according to claim 41, wherein using a redundant circuit within the integrated circuit (IC) instead of the identified defective circuit further comprises routing a set of input/output signals to the redundant circuit instead of the identified defective circuit.

45. The method according to claim 44, wherein routing a set of input/output signals to the redundant circuit instead of the identified defective circuit further comprises:
routing an input signal to the redundant circuit instead of the identified defective circuit; and
using an output signal of the redundant circuit instead of an output signal of the identified defective circuit.

46. The method according to claim 41, wherein retrieving information about a defect in the integrated circuit (IC) further comprises retrieving information that is generated by testing the integrated circuit (IC) to identify a defective circuit, and coding the information about the defect in the set of programmable elements.

47. The method according to claim 46, wherein the integrated circuit (IC) comprises a programmable logic device (PLD).

48. The method according to claim 47, wherein the defective circuit comprises a memory circuit within the programmable logic device (PLD).

49. The method according to claim 48, wherein the defective circuit comprises programmable logic circuitry within the programmable logic device (PLD).

50. The method according to claim 48, wherein the defective circuit comprises programmable interconnect circuitry within the programmable logic device (PLD).

* * * * *